(12) United States Patent
Nakamura

(10) Patent No.: US 8,580,611 B2
(45) Date of Patent: Nov. 12, 2013

(54) METHOD FOR MANUFACTURING WIRING SUBSTRATE

(75) Inventor: Masahiko Nakamura, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/494,744

(22) Filed: Jun. 12, 2012

(65) Prior Publication Data

US 2012/0322205 A1  Dec. 20, 2012

(30) Foreign Application Priority Data

Jun. 16, 2011  (JP) .................................. 2011-134312

(51) Int. Cl.
*H01L 21/00* (2006.01)

(52) U.S. Cl.
USPC .......................................... 438/108; 438/107

(58) Field of Classification Search
USPC ........................................................ 438/108
See application file for complete search history.

(56) References Cited

U.S. PATENT DOCUMENTS

| | | | |
|---|---|---|---|
| 2005/0206009 A1* | 9/2005 | Tamadate ...................... | 257/777 |
| 2008/0138934 A1* | 6/2008 | Kim et al. ..................... | 438/109 |
| 2010/0078830 A1* | 4/2010 | Katsurayama et al. ....... | 257/777 |

FOREIGN PATENT DOCUMENTS

| | | |
|---|---|---|
| JP | 07-007244 A | 1/1995 |
| JP | 2008-004602 A | 1/2008 |

* cited by examiner

*Primary Examiner* — Charles Garber
*Assistant Examiner* — Brigitte Paterson
(74) *Attorney, Agent, or Firm* — Wolf, Greenfield & Sacks, P.C.; Randy J. Pritzker

(57) ABSTRACT

A method for manufacturing a wiring substrate includes forming a first pad and a second pad on one side of a substrate, plating a surface of the second pad to form a bonding pad used for a wire-bonded connection, covering a surface of the first pad with an adhesive layer, adhering solder powder to the adhesive layer, applying flux containing halogen to the substrate, and melting the solder powder and covering the first pad with a solder to form a connection pad used for a flip-chip-connection. The flux has a halogen concentration of less than or equal to 0.15 wt %.

2 Claims, 8 Drawing Sheets

| Br Concentration | Sn Color Change Defect Occurrence Rate In Au Plating | Insufficient Wettability Occurrence Rate |
|---|---|---|
| 0.10% | 0% (0/144pcs) | 4.60% (4/87pcs) |
| 0.15% | 0% (0/144pcs) | 1.19% (1/84pcs) |
| 0.20% | 8.33% (12/144pcs) | 0% (0/78pcs) |
| 0.25% | 9.03% (13/144pcs) | 1.09% (1/92pcs) |

| Sample | C (at%) | N (at%) | O (at%) | S (at%) | Cu (at%) | Sn (at%) | Au (at%) | Total |
|---|---|---|---|---|---|---|---|---|
| 1 | 41.6 | 0.6 | 11.9 | 0.4 | 2.8 | 4.3 | 38.3 | 100.0 |
| 2 | 28.1 |  | 22.5 |  | 4.7 | 10.5 | 34.3 | 100.0 |
| 3 | 20.0 |  | 35.8 |  |  | 22.5 | 21.8 | 100.0 |

| Sample | C /Base | N /Base | O /Base | S /Base | Cu /Base | Sn /Base | Au (Base) /Base |
|---|---|---|---|---|---|---|---|
| 1 | 1.08 | 0.02 | 0.31 | 0.01 | 0.07 | 0.11 | 1.00 |
| 2 | 0.82 | 0.00 | 0.66 | 0.00 | 0.14 | 0.31 | 1.00 |
| 3 | 0.92 | 0.00 | 1.64 | 0.00 | 0.00 | 1.03 | 1.00 |

METHOD FOR MANUFACTURING WIRING SUBSTRATE

CROSS-REFERENCE TO RELATED APPLICATIONS

This application is based upon and claims the benefit of priority from prior Japanese Patent Application No. 2011-134312, filed on Jun. 16, 2011, the entire contents of which are incorporated herein by reference.

BACKGROUND

The present invention relates to a method for manufacturing a wiring substrate.

FIG. 1 illustrates a semiconductor device 70 including semiconductor elements 71 and 72 mounted on a substrate 73. The semiconductor element 71 is flip-chip-connected to the substrate 73, and the semiconductor element 72 is wire-bonded to the substrate 73. In the semiconductor device 70, bumps 71A, which are arranged on the semiconductor element 71, are flip-chip-connected to connection pads 74, which are formed on an upper surface of the substrate 73. Electrodes 72A are formed on an upper surface of the semiconductor element 72, which is stacked on the semiconductor element 71. The electrodes 72A are wire-bonded by wires 76 to bonding pads 75 formed on the upper surface of the substrate 73.

The mounting of the semiconductor elements 71 and 72 on the substrate 73 using flip-chip connections and wire-bonded connections is effective for miniaturizing the semiconductor device 70. However, the semiconductor elements 71 and 72 are mounted on the substrate 73 using the different connections of flip-chip connections and wire-bonded connections. This results in the need for forming the connection pads 74 for the flip-chip connections and the bonding pads 75 for the wire-bonded connections on the substrate 73.

The connection pads 74, which are joined with bumps 71A of the semiconductor element 71, and the bonding pads 75, which are bonded with the wires 76, undergo different surface treatments. More specifically, the surfaces of the connection pads 74 are coated by solder, and the surfaces of the bonding pads 75 are plated (e.g., nickel plating or gold plating). In this case, after a wiring pattern (not illustrated), pad material for the connection pads 74, and pad material for the bonding pads 75 are applied to the surface of the substrate 73, the pad material of the bonding pads 75 is plated. Then, the pad material of the connection pads 74 is coated with solder. The procedures for coating the pad material of the connection pads 74 with solder will now be described with reference to FIGS. 1 to 4.

First, the bonding pads 75 are covered with masking tape so that solder does not collect on the bonding pads 75. Then, an adhesion layer is applied to the surfaces of pads 74A, which form the connection pads 74. Afterwards, solder powder 78 is deposited on the surface of the adhesion layer. The upper part of FIG. 2 is a plan view illustrating the substrate 73 on which the pads 74A, which are for the connection pads 74, and the bonding pads 75 are formed. The lower part of FIG. 2 illustrates a state in which the solder powder 78 is deposited on the adhesion layer covering the pads 74A.

After removing the masking tape, as illustrated in FIG. 3, flux 79 is applied by a spray nozzle 80 to the entire surface of the substrate 73. Then, a reflow process is performed to melt the solder powder 78 (refer to FIG. 2) and coat the surface of each pad 74A with solder 74B as illustrated in FIG. 4. Afterwards, the flux 79 is removed to obtain the substrate 73 (the wiring substrate) on which the connection pads 74 and bonding pads 75 are formed.

Japanese Laid-Open Patent Publications Nos. 2008-004602 and 07-007244 describe the related art described above.

SUMMARY

The application of the flux 79 is performed prior to the reflow process to prevent the surface of the solder 74B from oxidizing and to improve the joining of the solder 74B and the pads 74A. Here, it is difficult to selectively apply the flux 79 to only portions of the solder powder 78. Thus, the flux 79 is applied to the entire surface of the substrate 73. However, the flux 79 is also applied to the plated surfaces of the bonding pads 75. As a result, tin (Sn) ions melted into the flux 79 are re-deposited on the plating (e.g., Au plating) of the bonding pas 75. The inventor of the present invention has noticed that the deposited tin changes the color of the bonding pads 75. Further, the inventor of the present invention has noticed that the color change of the bonding pads 75 causes non-bonded wires when wire bonding is performed in a subsequent process.

One aspect of the present invention is a method for manufacturing a wiring substrate. The method includes forming a first pad and a second pad on one side of a substrate, plating a surface of the second pad to form a bonding pad used for a wire-bonded connection, covering a surface of the first pad with an adhesive layer, adhering solder powder to the adhesive layer, applying flux containing halogen to the substrate, and melting the solder powder and covering the first pad with a solder to form a connection pad used for a flip-chip-connection. The flux has a halogen concentration of less than or equal to 0.15 wt %.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

One embodiment will now be described with reference to the accompanying drawings. The accompanying drawings schematically illustrate structures and do not depict actual scale.

A method for manufacturing a wiring substrate will now be described with reference to FIGS. 5 to 10.

Figure 5A:
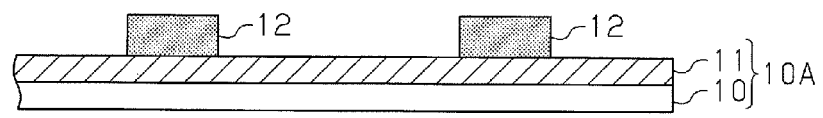
FIGS. 5A to 5D are schematic cross-sectional views illustrating the procedures for manufacturing a wiring substrate of one embodiment.

Referring to FIG. 5A, a copper foil 11 is applied to one side of a resin substrate 10 to prepare a single-sided copper clad laminate substrate 10A. A resist film is applied to the surface of the copper foil 11. Then, the resist film is exposed and developed to form a resist pattern 12 on the surface of the copper foil 11. The resist pattern 12 covers a given wiring pattern (not illustrated), pattern portions of connection pads 13 (refer to FIG. 7C) used for flip-chip connections, and pattern portions of bonding pads 14 (refer to FIG. 5C) used for wire-bonded connections.

Figure 5B:

Next, referring to FIG. 5B, the copper foil 11 is etched, using the resist pattern 12 as an etching mask, to pattern given shapes in the copper foil 11. This forms a given wiring pattern (not illustrated), a first pad 13A, which is used for a connection pad, and a second pad 14A, which is used for a bonding pad 14, on one side 10S (a main surface) of the substrate 10. Subsequent to the patterning of the copper foil 11, for example, ashing is performed to remove the resist pattern 12.

Figure 5C:

Then, referring to FIG. 5C, a plating layer 14B is applied to the surface of the second pad 14A to form a bonding pad 14. In the present embodiment, a nickel (Ni) plating and a gold (Au) plating are laminated in this order on the second pad 14A to form the plating layer 14B. When applying the plating layer 14B to the second pad 14A, the first pad 13A is covered by a mask (not illustrated) so that plating liquid does not soak on the first pad 13A. For example, a plating resist is used as the mask.

Figure 5D:
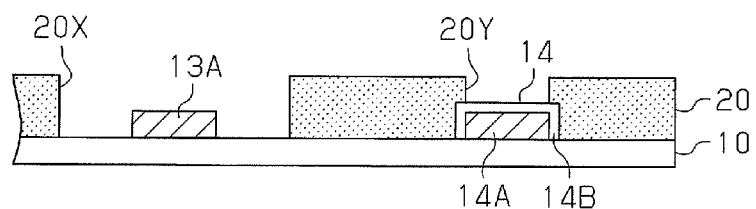

Next, as illustrated in FIG. 5D, a solder resist layer 20 is formed on the substrate 10. The solder resist layer 20 includes an opening 20X, which exposes the first pad 13A, and an opening 20Y, which exposes part of the bonding pad 14. For example, after forming the solder resist layer 20 so as to cover the wiring pattern (not illustrated), the first pad 13A, the bonding pads 14, and the surface of the substrate 10, a photolithography process is performed to expose and develop the solder resist layer 20 and form the openings 20X and 20Y. For example, an insulative resin such as an epoxy resin may be used as the material of the solder resist layer 20. The solder resist layer 20 may be formed before applying the plating layer 14B to the surface of the second pad 14A.

Figure 6A:
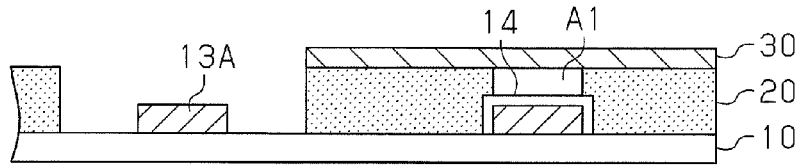
FIGS. 6A to 6E are schematic cross-sectional views illustrating the procedures for manufacturing the wiring substrate of the embodiment.

Next, referring to FIG. 6A, tape 30 (masking tape) is applied to a region A1 in which the bonding pad 14 is formed on the substrate 10. The tape 30 is adhered to the upper surface of the solder resist layer 20 formed near the bonding pad 14 to cover the region A1. In this state, the upper surface of the solder resist layer 20 is located above the upper surface of the bonding pad 14. Thus, when the tape 30 is adhered to the upper surface of the solder resist layer 20, the tape 30 closes the opening 20Y of the solder resist layer 20 at a position separated from the upper surface of the bonding pad 14.

The tape 30 includes a base material and an adhesive layer. For example, a vinyl chloride resin may be used as the base material of the tape 30. The material for the adhesive layer of the tape 30 is preferably a material that does not obstruct wire-bonding even when an adhesive agent remains on the bonding pad 14 and may be, for example, an acrylic resin.

Figure 6B:
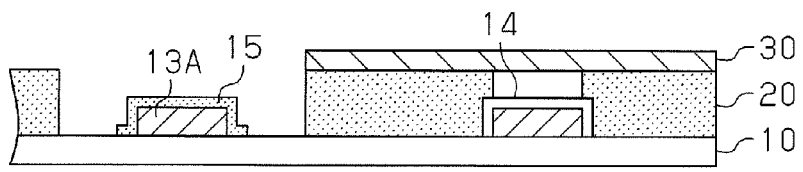

Next, referring to FIG. 6B, an adhesive layer 15 is formed to cover the surfaces (upper surface and side surfaces) of the first pad 13A. The adhesive layer 15 is applied to the surface of the first pad 13A by immersing the substrate 10 (structure illustrated in FIG. 6A) in an adhesive liquid tank. A solution including at least one of a naphthotriazole derivative, benzotriazole derivative, imidazole derivative, polybenzimidazole derivative, mercaptobenzothiazole derivative, and benzothiazolethio-fatty acid may be used as the adhesive liquid. Such an adhesive liquid is selectively adhered to the surface of the first pad 13A, which is made of copper, and not adhered to the surfaces of the solder resist layer 20 and the substrate 10. Further, since the bonding pad 14 is covered by the tape 30, the adhesive liquid does not soak on the bonding pad 14 even when immersing the substrate 10 in the adhesive liquid tank. Accordingly, when the substrate 10 is washed with water to remove the adhesive liquid and then dried, the adhesive layer 15 is selectively formed on only the surfaces (upper surface and side surfaces) of the first pad 13A.

Figure 6C:
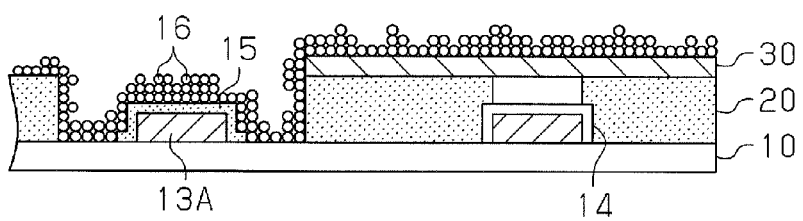

Then, referring to FIG. 6C, solder powder 16 is deposited on the substrate 10 from above. Due to the adhesive layer 15, the solder powder 16 that falls onto the first pad 13A is adhered to the surface of the first pad 13A. Here, the solder powder 16 also soaks on the substrate 10, the solder resist layer 20, and the tape 30. For example, tin—silver—copper (Sn—Ag—Cu), tin—silver (Sn—Ag), and tin—copper (Sn—Cu) may be used as the material of the solder powder 16.

Figure 6D:
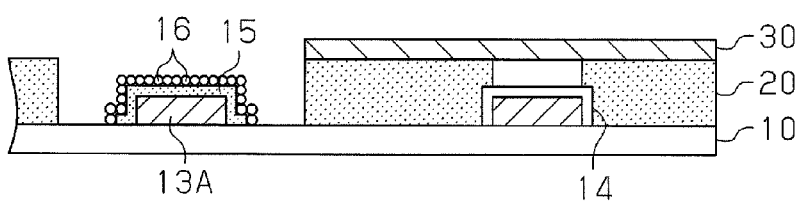

Next, referring to FIG. 6D, the solder powder 16 soaked on the substrate 10, the solder resist layer 20, and the tape 30 in the prior process (FIG. 6C), that is the unnecessary solder powder 16 soaked at locations other than the first pad 13A is removed by, for example, blowing air or spraying water.

Figure 6E:
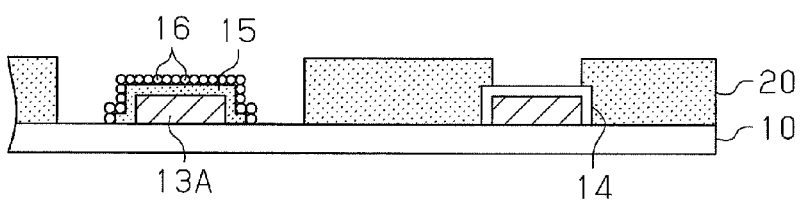

Subsequently, referring to FIG. 6E, the tape 30 is delaminated before performing a heat process. This is because the tape 30 is not heat resistant. Then, the solder powder 16 is temporarily adhered to the first pad 13A (adhesive layer 15). The temporary adhering process is a process for slightly melting the solder powder 16 to adhere the solder powder 16 to the first pad 13A. For the temporary adhesion of the solder powder 16, the substrate 10 is heated in a furnace at, for example, approximately 170° C. for approximately one hour.

Figure 1:
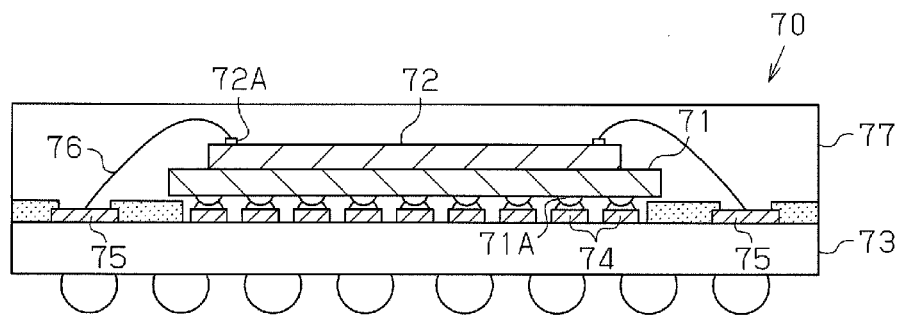
FIG. 1 is a schematic cross-sectional view illustrating a semiconductor device of the related art.
Figure 2:
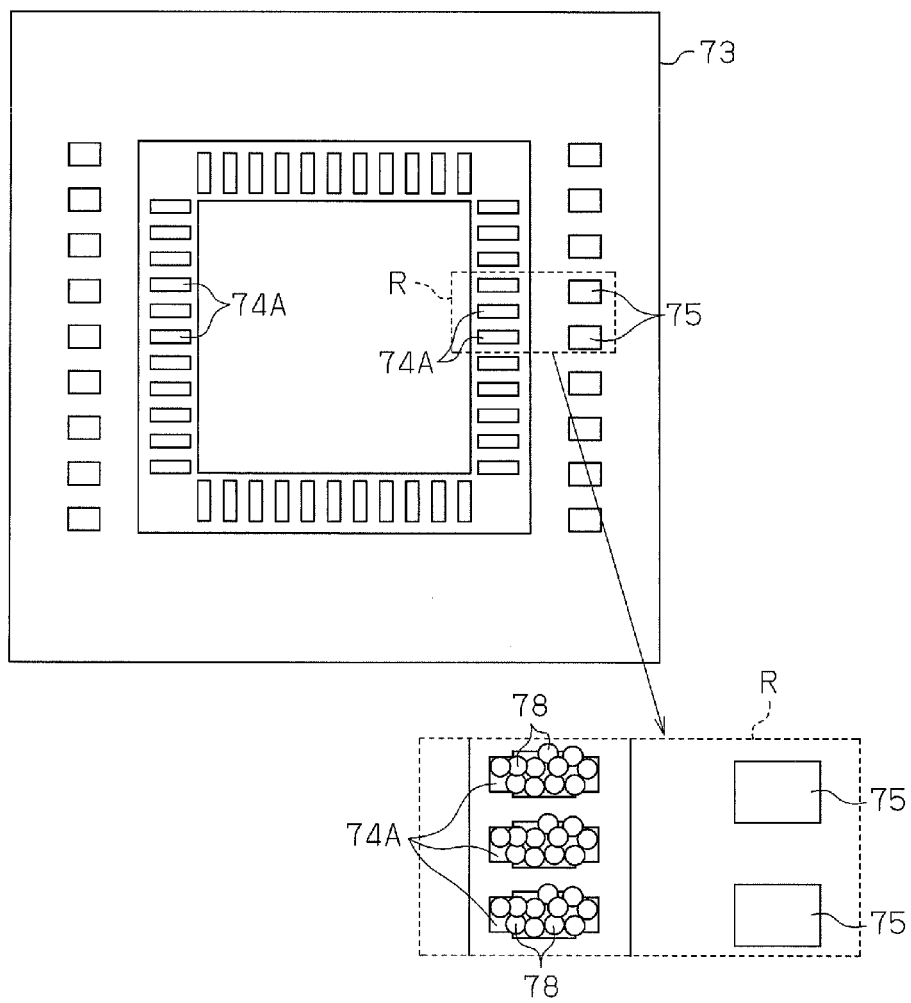
FIG. 2 is a schematic plan view illustrating a wiring substrate of the related art.
Figure 3:
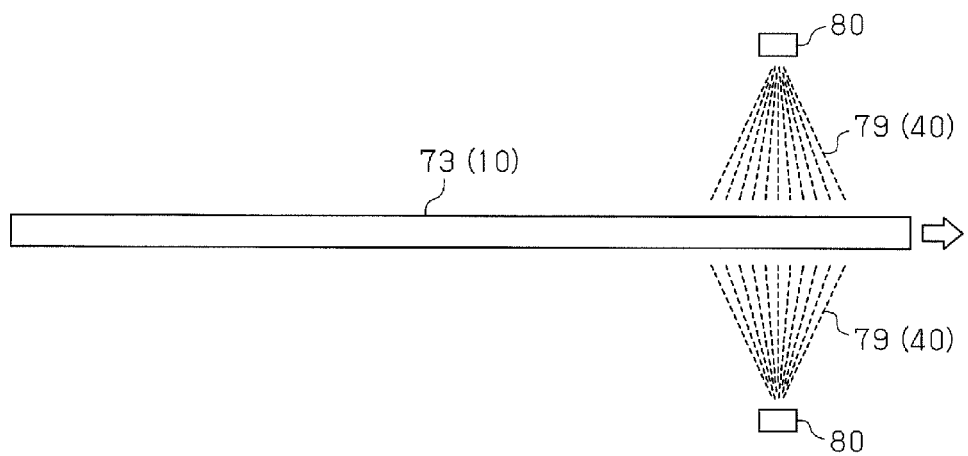
FIG. 3 is a diagram illustrating the application of flux in the related art.
Figure 4:
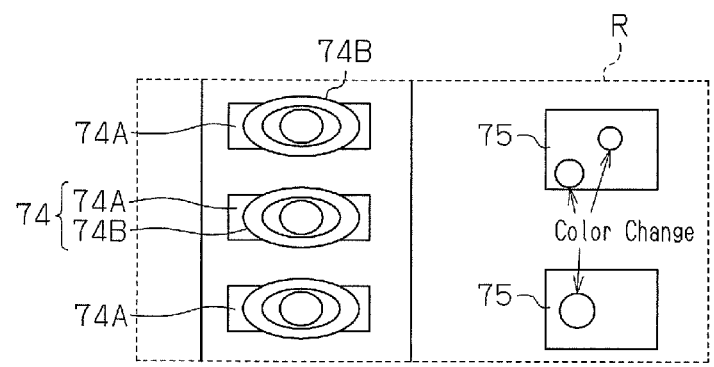
FIG. 4 is an enlarged plan view illustrating the wiring substrate of the related art.
Figure 7A:
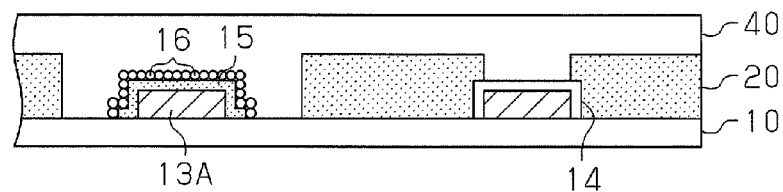
FIGS. 7A to 7C are schematic cross-sectional views illustrating the procedures for manufacturing the wiring substrate of the embodiment.

Next, referring to FIG. 7A, flux 40 is applied to the first pad 13A, to which the solder powder 16 is temporarily adhered and which is formed on the substrate 10. Here, the application of the flux 40 would be sufficient as long as the flux 40 is applied to the first pad 13A (i.e., portion that is pre-coated with solder). However, it is difficult to apply the flux 40 to just the first pad 13A. Thus, as illustrated in FIG. 7A, the flux 40 is applied to the entire upper surface of the substrate 10. In other words, the flux 40 is also applied to the bonding pad 14. The flux 40 allows for satisfactory flowability of a solder 13B (refer to FIG. 7B), which is obtained by melting the solder powder 16, and satisfactory joining of the solder 13B and the first pad 13A. For example, water soluble flux may be used as the flux 40. The flux 40 contains halogen. In the present embodiment, the flux 40 contains bromine (Br). To reduce color changes of the bonding pad 14 caused by the flux 40 applied to the bonding pad 14, the halogen concentration of the flux 40 (halogen content rate) is preferably less than or equal to 0.15 wt % and more preferably in the range of greater than or equal to 0.10 wt % to less than or equal to 0.15 wt %. Accordingly, the bromine (Br) concentration in the flux 40 is set to be less than or equal to 0.15 wt %. The flux application process (FIG. 7A) may be performed by, for example, spraying the flux 40 onto the substrate 10 from spray nozzles 80 as illustrated in FIG. 3.

Figure 7B:
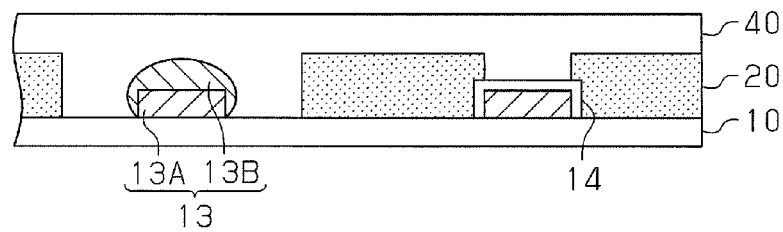

Next, as illustrated in FIG. 7B, a reflow process is performed for approximately 30 seconds at a temperature that is greater than or equal to the melting point of solder to melt the solder powder 16 on the first pad 13A. This covers the surface of the first pad 13A with the solder 13B and forms the connection pad 13. The adhesive layer 15 (refer to FIG. 7A), which is formed to cover the surface of the first pad 13A, melts in the flux 40 during the reflow process.

Figure 7C:
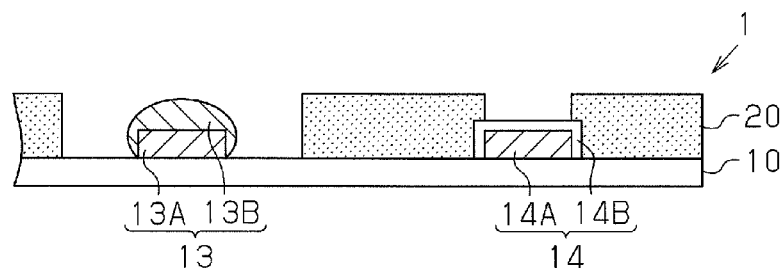

Then, referring to FIG. 7C, the flux 40 is washed away. The manufacturing processes described above manufactures the wiring substrate 1 having the structure illustrated in FIG. 7C. In the wiring substrate 1, the solder 13B covers the surface of the first pad 13A and forms the connection pad 13 used for flip-chip connection. Further, the plating layer 14B is applied to the surface of the second pad 14A to form the bonding pad 14 used for a wire-bonded connection. This provides the wiring substrate 1, onto which a semiconductor element is flip-chip-connected and a semiconductor element is wire-bonded.

The procedures described in Japanese Laid-Open Patent Publication No. 07-007244, for example, may be performed so that the solder powder 16 is adhered onto the surface of the first pad 13A with the adhesive layer 15 and so that the surface of the first pad 13A is covered with the solder 13B through the reflow process.

Figure 8:
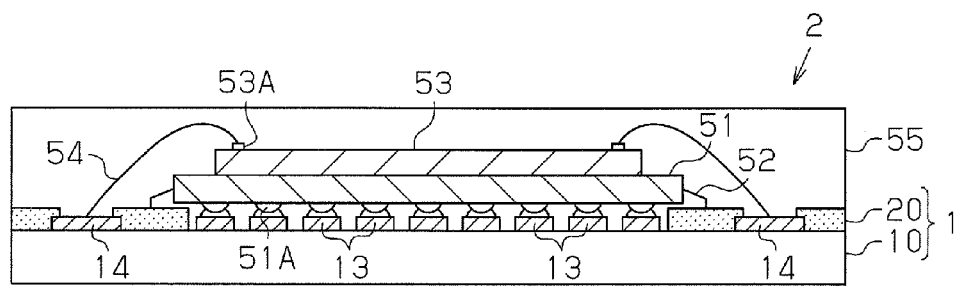
FIG. 8 is a schematic cross-sectional view illustrating the procedures for manufacturing the wiring substrate of the embodiment.

A method for manufacturing a semiconductor device 2, which is illustrated in FIG. 8, with the wiring substrate 1 described above will now be briefly described.

Bumps 51A (e.g., gold bumps or solder bumps), which are arranged on a first (lower) semiconductor element 51, are flip-chip-connected to the connection pads 13, which are formed on the upper surface of the wiring substrate 1. Next, an underfill resin 52 is applied between the wiring substrate 1 and the semiconductor element 51. A second (upper) semiconductor element 53 is adhered to the semiconductor element 51 by an adhesive agent. Electrode pads 53A, which are formed on the upper surface of the semiconductor element 53, are wire-bonded by bonding wires 54 (e.g., gold wires) to the bonding pads 14, which are formed on the upper surface of the wiring substrate 1. Then, elements such as the semiconductor elements 51 and 53 and the bonding wires 54 are sealed by a sealing resin 55. In this manner, the semiconductor elements 51 and 53 are stacked onto the wiring substrate 1. That is, the first semiconductor element 51 is flip-chip connected to the wiring substrate 1 and the second semiconductor element 53 is wire-bonded to the wiring substrate 1 to obtain the semiconductor device 2.

The evaluation results of the relationship between the halogen concentration in the flux 40 and the color change occurrence rate of the bonding pads 14 will now be described.

Figures 12, 13A, 13B:
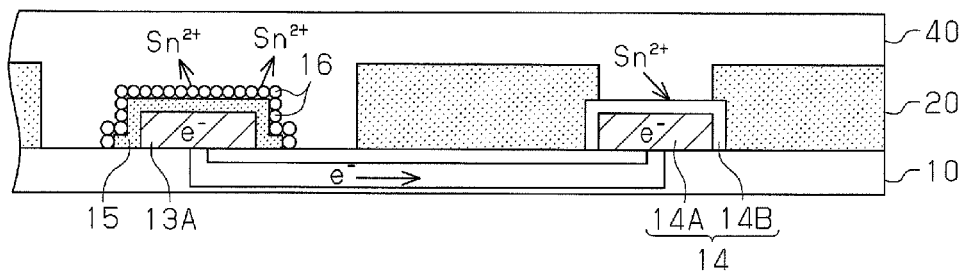
FIG. 12 is a schematic diagram illustrating the mechanism in which color changes occur in bonding pads.
FIGS. 13A and 13B are tables illustrating AES qualitative-quantitative analysis results.

First, the mechanism in which non-bonded wires occur in bonding pads 14 during the wire bonding process will be discussed. Referring to FIG. 7A, when the flux 40 is applied to the entire upper surface of the substrate 10, the flux 40 connects the first pad 13A, which are for the connection pad 13, to the bonding pad 14. Referring to FIG. 12, the first pad 13A and the bonding pad 14 are electrically connected by an internal wire (not illustrated) in the substrate 10. As a result, a local battery effect moves tin ions ($Sn^{2+}$), which melt into the flux 40 from the solder powder 16, toward the bonding pads 14. This deposits tin (Sn) onto the plating layer 14B (Au plating) of the bonding pad 14 and changes the color of the surface of the bonding pad 14. It is considered that this causes non-bonded wires when wire bonding is performed.

FIGS. 13A and 13B illustrate the measurement results of elements present in the surface of a bonding pad that was wire-bonded. An Auger Electron Spectroscopy (AES) qualitative-quantitative analyzer was used to perform the measurement. More specifically, FIGS. 13A and 13B illustrate the results of a quantitative analysis in which the flux halogen concentration was set to 1.5 wt % and bonding pads (samples 1 to 3 described below) of the wiring substrate were obtained through the manufacturing method illustrated in FIGS. 5 to 7.

Sample 1: Bonding pad of which the bonding strength with a wire-bonded bonding wire is sufficient.

Sample 2: Bonding pad that was not bonded with a bonding wire during wire bonding and does not include any visible color changes.

Sample 3: Bonding pad that was not bonded with a bonding wire during wire bonding and includes visible color changes.

FIG. 13A illustrates relative quantitative results, and FIG. 13B illustrates atomic ratios relative to a base (in this case, Au). In FIG. 13A, each empty block indicates a result that is less than or equal to the detection limit and is not included in a quantitative calculation. In FIG. 13B, "0.00" indicates a result that is less than or equal to the detection limit and is not included in a quantitative calculation.

As apparent from the results illustrated in FIG. 13A, the amount of Sn present in the surfaces of the bonding pads of samples 2 and 3, which were not bonded with bonding wires, is approximately two to five times greater than that of the sample 1, which was bonded with a bonding wire. As apparent from the results illustrated in FIG. 13B, in the bonding pads of samples 2 and 3, the atomic ratio of Sn, which is present in the surface of the bonding pad, relative to Au is three to ten times greater than that of sample 1. Accordingly, it can be understood that Sn, which is present in the surface of the bonding pad, adversely affects the bonding of the bonding wire. Further, the amount of Sn present in the surface of the bonding pad of sample 3 of which color change is visible is approximately two times greater than that of sample 2 of which color change is not visible. It is thus apparent that the color change of the bonding pad occurs due to Sn. Accordingly, it can be understood that Sn, which is present in the surface of the bonding pad, changes the color of the bonding pad and causes non-bonding of a bonding wire.

The occurrence of a non-bonded wire is caused by flux that connects the first pad 13A and the bonding pad 14. Thus, for example, a reflow process may be performed in a state in which the flux 40 is applied to the substrate 10 with the first pad 13A and the bonding pad 14 directed downward. In this case, gravitational force pulls liquid droplets of the flux 40 in a downward direction and suppresses connection of the first pad 13A and the bonding pad 14 through the flux 40. This results in the local battery becoming inactive and may suppress the deposition of Sn on the bonding pad 14 and suppress the occurrence of a color change in the bonding pad 14.

However, recent electronic devices have become smaller and thinner, and there is a demand for a denser and smaller wiring substrate. This has resulted in a decrease in the distance between the connection pad 13 and the bonding pad 14. For example, when the distance between the connection pad 13 and the bonding pad 14 is decreased to 500 μm or less, the probability of the first pad 13A and the bonding pad 14 being connected by the flux 40 becomes high even when the flux 40 is applied in a state in which the connection pad (first pad 13A) and the bonding pad 14 are directed downward. This increases the color change occurrence rate of the bonding pad 14.

To prevent the application of the flux 40 to the bonding pad 14, the flux 40 may be applied in a state in which the bonding pad 14 is masked with a masking tape or the like. However, in such a case, the high temperature of the reflow process may produce an adhesive residue of the masking tape.

Figures 9, 10:
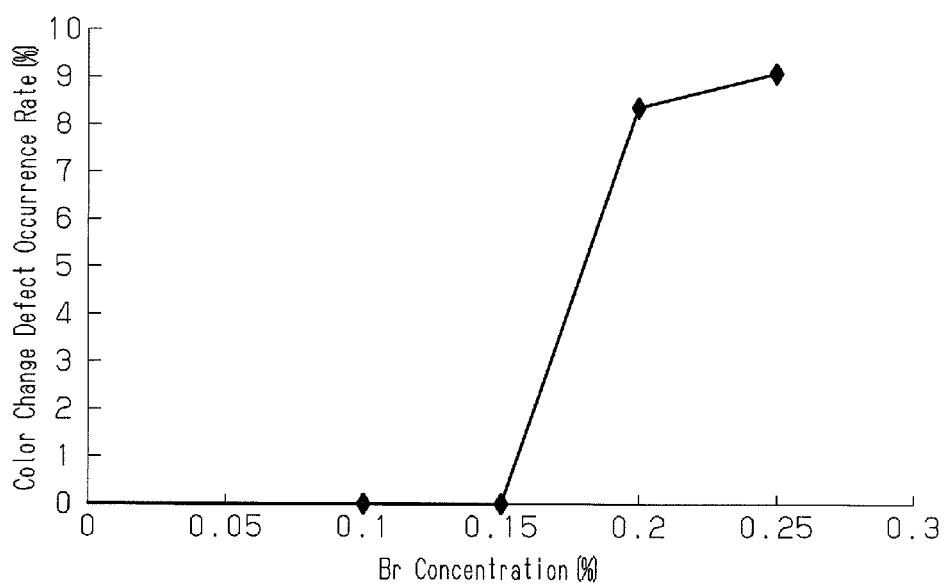
FIG. 9 is a table illustrating the relationship between the halogen concentration of flux, the color change occurrence rate of a bonding pad, and the occurrence rate of insufficient wetting of a connection pad.
FIG. 10 is a graph illustrating the relationship between the halogen concentration of flux and the color change occurrence rate of the bonding pad.

In this regard, the inventor of the present invention has found that the melting of $Sn^{2+}$ into the flux 40 from the solder powder 16 is suppressed by lowering the halogen concentration of the flux 40 and reducing activity of the flux 40, thereby suppressing the deposition of Sn on the bonding pad 14. FIGS. 9 and 10 illustrate evaluation results of the relationship between the halogen concentration (Br concentration) of the flux 40 and the color change occurrence rate of the bonding pad 14. More specifically, FIGS. 9 and 10 illustrate the results of the outer appearance of the connection pad 13 and the bonding pad 14 after the reflow process is performed and flux is washed away in cases in which flux is set to have halogen concentrations set to 0.10 wt %, 0.15 wt %, 0.20 wt %, and 0.25 wt % and applied to the structure (refer to FIG. 6E) manufactured through the manufacturing method illustrated in FIGS. 5 and 6. In this measurement, after immersing the structure of FIG. 6E in flux, which is contained in a one-liter container, the flux is dripped for ten seconds, and a total of approximately 1.6 g of the flux is applied to the two sides of the substrate. Further, in this measurement, the halogen concentration was measured for each of 144 bonding pads. The flux used for this measurement includes only Br as a halogen. Thus, the Br concentration corresponds to the halogen concentration.

As apparent from the results illustrated in FIGS. 9 and 10, as the Br concentration in the flux decreases, the color changing occurrence rate of the plating layer 14B (Au plating) of the bonding pad 14 decreases. Further, when the Br concentration is less than or equal to 0.15 wt %, the color changing occurrence rate of the bonding pads 14 is 0%. From these results, it can be understood that color changing defects may be suppressed in a preferable manner by setting the halogen concentration of the flux 40 to less than or equal to 0.15 wt %.

From the results of FIG. 9, it is apparent that the occurrence probability of insufficient wetting in the connection pad 13 becomes high as the Br concentration in the flux becomes low. It is considered that this is because a lower Br concentration of the flux increases the surface tension, and the increased surface tension causes insufficient wetting of the connection pad 13. However, in this regard, even when the halogen concentration is 0.10 wt %, the occurrence rate of insufficient wetting is 4.60% and low. Thus, insufficient wetting of the connection pad 13 may be avoided by, for example, changing (optimizing) the design pattern of the connection pad 13. Accordingly, this is not a significant problem in practice. Namely, even when the halogen concentration of the flux 40 is decreased, the flux 40 functions, as originally intended, to obtain satisfactory wetting of the solder 13B and satisfactory joining of the solder 13B and the first pad 13A.

Accordingly, the halogen concentration of the flux 40 is preferably less than or equal to 0.15 wt % and more preferably greater than or equal to 0.10 wt % and less than or equal to 0.15 wt %.

The present embodiment has the advantages described below.

(1) The halogen concentration of the flux 40 is set to less than or equal to 0.15 wt %. Thus, even when first pad 13A and the bonding pad 14 are temporarily connected by the flux 40, the melting of Sn into the flux 40 from the solder powder 16 is suppressed, and the deposition of Sn on the bonding pad 14 is suppressed. As a result, the occurrence of a color change of the bonding pad 14 caused by Sn is suppressed in a preferable manner, and the non-bonding of a bonding wire during wire bonding is suppressed.

(2) The distance between the connection pad 13 and the bonding pad 14 may be decreased. This allows for further miniaturization of the wiring substrate 1.

It should be apparent to those skilled in the art that the present invention may be embodied in many other specific forms without departing from the spirit or scope of the invention. Particularly, it should be understood that the present invention may be embodied in the following forms.

In the above embodiment, the substrate 10 is immersed in an adhesive liquid tank after masking the bonding pad 14 with the tape 30 to selectively cover the surface of the first pad 13A, which forms the connection pad 13, with the adhesive layer 15. However, the present invention is not limited in such a manner. For example, the adhesive layer 15 may be selectively adhered to only the surface of the first pad 13A without masking the bonding pad 14 by adjusting the composition of the adhesive liquid as described in, for example, Japanese Laid-Open Patent Publication No. 2008-004602. For example, the adhesive layer 15 may be selectively adhered to only the surface of the first pad 13A by using two types of adhesive liquids, namely, a first adhesive liquid adhered to the surface of the first pad 13A and the surface of the bonding pad 14 and a second adhesive liquid, which delaminates the adhesive layer formed on the surface of the bonding pad 14.

Figure 11:
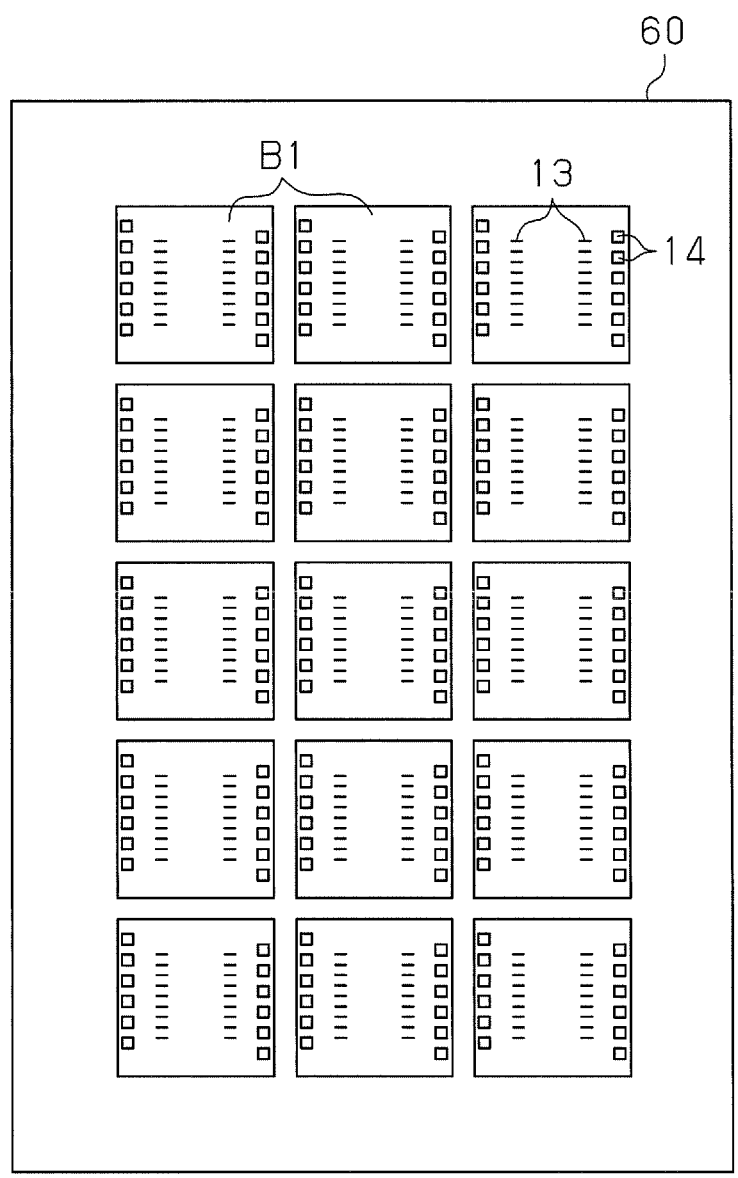
FIG. 11 is a schematic plan view illustrating a workpiece.

The embodiment described above is applied to a single substrate portion or semiconductor device. However, the present invention is not limited in such a manner. For example, as illustrated in FIG. 11, a large substrate including semiconductor regions B1 arranged in rows and columns may be prepared as a workpiece 60 from which a plurality of semiconductor devices may be obtained. In this case, a plurality of wiring substrates 1 and semiconductor devices using the wiring substrates 1 are manufactured and consequently separated from one another.

The present examples and embodiments are to be considered as illustrative and not restrictive, and the invention is not to be limited to the details given herein, but may be modified within the scope and equivalence of the appended claims.

The invention claimed is:

1. A method for manufacturing a wiring substrate, the method comprising:
   forming a first pad and a second pad on one side of a substrate;
   plating a surface of the second pad to form a bonding pad used for a wire-bonded connection;
   covering a surface of the first pad with an adhesive layer;
   adhering solder powder to the adhesive layer;
   applying flux containing halogen to the substrate; and
   melting the solder powder and covering the first pad with a solder to form a connection pad used for a flip-chip-connection,
   wherein the flux has a halogen concentration of greater than or equal to 0.10 wt% less than or equal to 0.15 wt %.

2. The method according to claim 1, wherein the covering of the surface of the first pad with the adhesive layer includes:
   adhering a masking tape to shield the bonding pad; and covering the surface of the first pad with the adhesive layer after shielding the bonding pad.

\* \* \* \* \*